United States Patent [19]

Lowenschuss

[11] Patent Number: 4,982,165
[45] Date of Patent: Jan. 1, 1991

[54] SET-ON OSCILLATOR

[75] Inventor: Oscar Lowenschuss, Santa Barbara, Calif.

[73] Assignee: Raytheon Company, Lexington, Mass.

[21] Appl. No.: 424,418

[22] Filed: Oct. 20, 1989

[51] Int. Cl.$^5$ .................. H03B 19/00; H03D 3/00; H03K 5/00; G06G 7/00

[52] U.S. Cl. .................................. 328/140; 328/138; 328/14; 307/523; 307/524; 307/529

[58] Field of Search ............... 307/522, 523, 524, 529; 328/14, 138, 140

[56] References Cited

U.S. PATENT DOCUMENTS 4,437,066 3/1984 Gordon .................................. 328/14
4,558,282 12/1985 Lowenschuss ...................... 307/523

Primary Examiner—Stanley D. Miller
Assistant Examiner—Yen Nguyen
Attorney, Agent, or Firm—Edmund J. Walsh; Richard M. Sharkansky

[57] ABSTRACT

A fast and inexpensive set-on oscillator is disclosed. According to the invention, the input signal is processed in two paths. In the first path, a coarse estimate of the input frequency is made. In the second path, the input signal is down converted to a baseband. The frequency of the relatively low frequency baseband signal is measured and a new signal at this frequency is synthesized. The synthesized signal is up converted in frequency. The down-conversion process is performed ambiguously and circuitry is included to resolve the ambiguity. The up conversion process is also performed ambiguously. The coarse estimate of the input frequency is used to resolve this ambiguity.

10 Claims, 3 Drawing Sheets

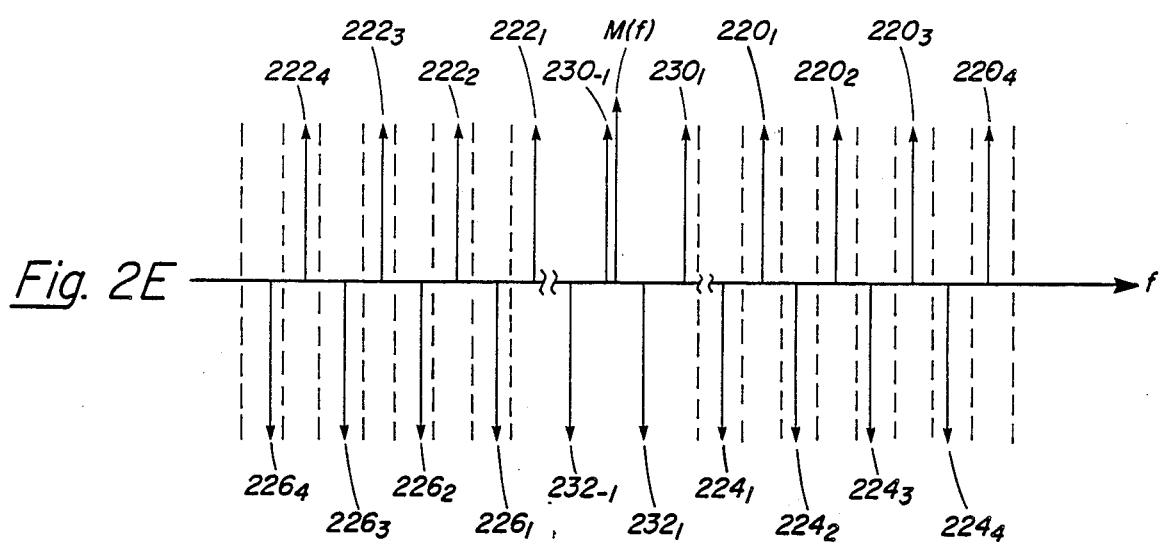
Fig. 2E
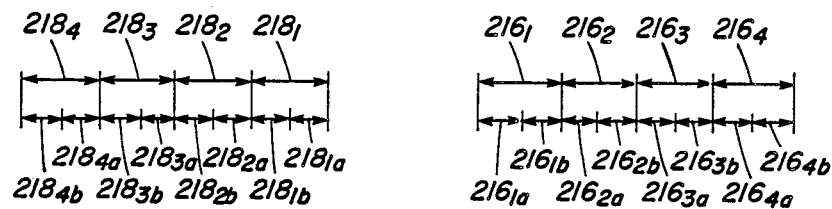
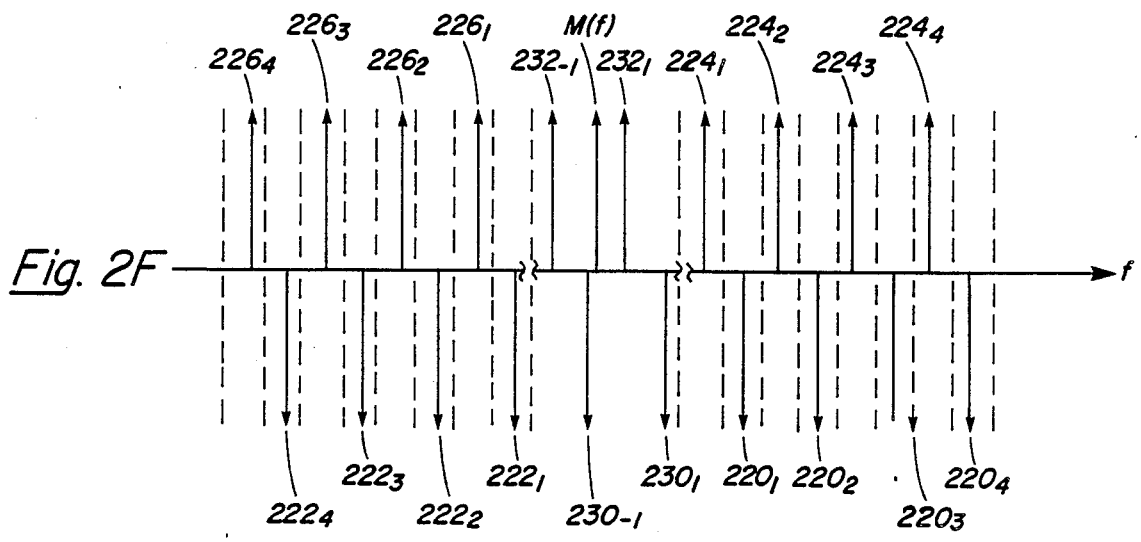
Fig. 2F
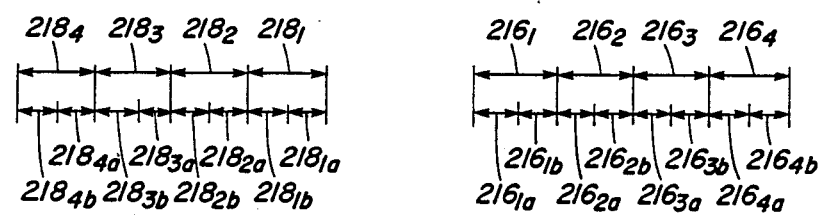

SET-ON OSCILLATOR

BACKGROUND OF THE INVENTION

This invention relates generally to radio systems and more particularly to an oscillator which adjusts its output frequency to match the frequency of an input signal.

In an electronic warfare environment, it is often desirable to have an apparatus that can transmit a signal at the same frequency as a received signal. One example of such an apparatus is a jammer. The jammer receives signals from an adversary's radar and then transmits a very strong signal at the same frequency. The strong signal disrupts the operation of the radar.

For a jammer, or other similar apparatus, to operate effectively, it must contain an oscillator that produces a signal at the same frequency as the input signal. Such an oscillator is called a "set-on oscillator" because its output frequency is "set-on" the input frequency.

In most applications, it is important that the set-on oscillator set-on the input frequency quickly. In some applications, the input signal is a short pulse such that the oscillator must set-on the input signal during the pulse. Additionally, it would be desirable for the set-on oscillator to be accurate and to be constructed relatively inexpensively.

SUMMARY OF THE INVENTION

With the foregoing background of the invention in mind, it is therefore an object of the present invention to provide an oscillator which can rapidly set-on an input frequency.

It is a further object of this invention to provide an accurate and economical set-on oscillator.

The foregoing and other are achieved by apparatus comprising: (a) means for producing a first signal having a frequency spectrum comprising the frequency spectrum of the input signal replicated at a predetermined frequency spacing; (b) means for filtering the first signal to produce a second signal having frequency components at frequencies less than one-half of the predetermined frequency spacing; (c) means for determining whether the second signal has a frequency spectrum containing a significant frequency component at a first frequency equal to the difference between: (i) the frequency of the input signal; and (ii) an integer multiple of the predetermined frequency; (d) means, responsive to the filtering means and the determining means, for producing a signal indicative of frequency, said signal (i) indicating the frequency of the second signal when the determining means indicates the second signal contains a significant frequency at the first frequency; and (ii) indicating the frequency of the second signal offset by a second frequency; (e) means, responsive to the means for producing a third signal indicative of frequency, for producing a signal at the indicated frequency; (f) means, responsive to the means for producing a third signal, for producing a fourth signal having a frequency spectrum comprising the spectrum of the third signal replicated at the predetermined frequency spacing; and (g) means for filtering the fourth signal to produce an output signal having a frequency substantially equal to the frequency of the input signal.

BRIEF DESCRIPTION OF THE DRAWINGS

The present invention may be better understood by the following more detailed description and the accompanying drawings in which FIG. 1 showing a simplified block diagram of a set-on oscillator constructed according to the invention; and FIGS. 2A–2F show frequency diagrams useful in understanding the operation of the set-on oscillator in FIG. 1.

DESCRIPTION OF THE PREFERRED EMBODIMENTS

Figure 1:
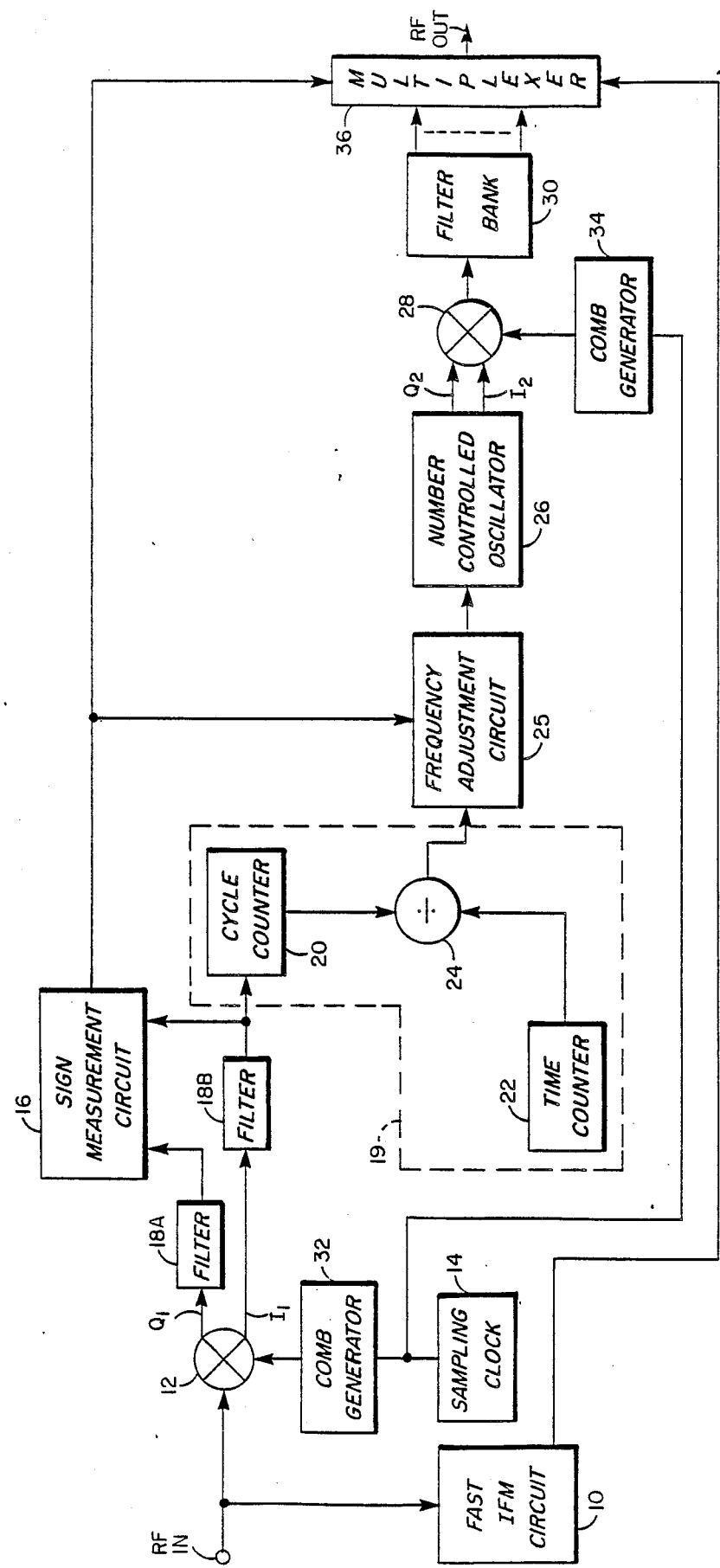

Turning now to FIG. 1, operation of a set-on oscillator constructed according to the invention can be understood. The set-on oscillator is constructed from a combination of analog and digital circuit elements known in the art. Elements common to all such circuits are not explicitly shown, but one of skill in the art will recognize that such elements are required. For example, power connections and timing signals are not explicitly shown.

In operation, an RF signal is applied to the terminal RF IN. The set-on oscillator operates to produce a signal at the terminal RF OUT having the same frequency. The input signal might represent a signal from a radio frequency receiver. The output signal might represent a signal provided to a radio frequency transmitter. Here, the input and output signals are such as might be transmitted by a continuous wave ("CW") radar. This limitation simplifies the description of the spectra associated with the signals. However, the same technique might be applied to other types of signals with more complex spectra.

The input signal at terminal RF IN is applied to a double balanced mixer 12 and fast instantaneous frequency measurement (IFM) circuit 10, the operation of which is explained below. Double balanced mixer 12 is a mixer of the type known in the art for producing an in-phase signal representing the product of the two input signals. A quadrature phase signal, equal to the in-phase signal delayed by 90°, is also produced. Double balanced mixers are sometimes referred to by other names such as single sideband samplers, quadrature phase detectors, or quadrature mixers. The in-phase signal is produced on the line designated $I_1$ and the quadrature phase signal is produced in the line designated $Q_1$.

The second input to double balanced mixer 12 is a signal produced by comb generator 32. As is known, a comb function analytically is a series of impulses of frequency spaced apart in frequency by $f_o$. In reality, the comb function is implemented as a series of narrow pulses at the periodic interval $1/f_o$. Here, the periodic interval is established by clock 14. Apparatus for producing a comb function and for implementing a sampling clock are known in the art.

The frequency spectrum of both the signals $I_1$ and $Q_1$ can be determined with known signal processing techniques. The frequency spectrum of $I_1$ and $Q_1$ is the frequency spectrum of the input repeated in the frequency domain at the periodic interval, $f_o$. This holds, provided there is no overlap of the repetitions, usually called "aliasing".

Figure 2A:
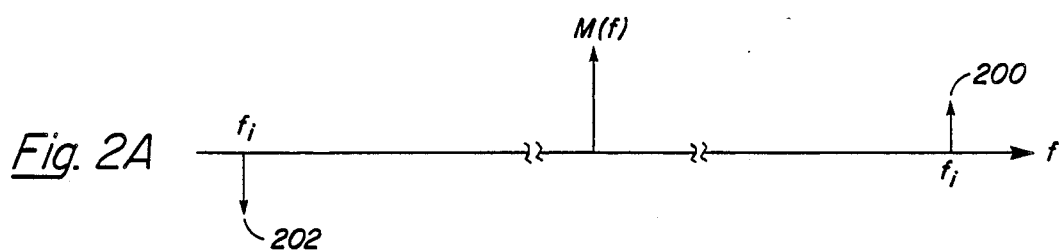
Figure 2B:
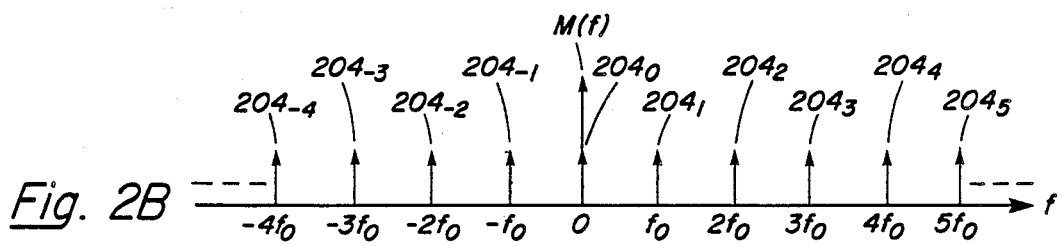

For the CW signals considered here, the input signal has a very narrow spectrum and the possibility of overlap is very remote. FIG. 2A shows the frequency spectrum of a signal at terminal RF IN. As can be seen, the spectrum consists of impulses 200 and 202 at frequencies $f_i$ and $-f_i$. As is known, this is the spectrum of a continuous sine wave at frequency $f_i$. FIG. 2B shows the frequency spectrum of the comb signal produced by comb generator 32. As shown, the spectrum comprises a plurality of impulses in frequency spaced by a frequency of $f_o$. Here, $f_o$ is smaller than $f_i$. For example, if $f_i$ is in the range of several gigaHertz, $f_o$ could be in the range of several hundred megaHertz.

Figure 2C:
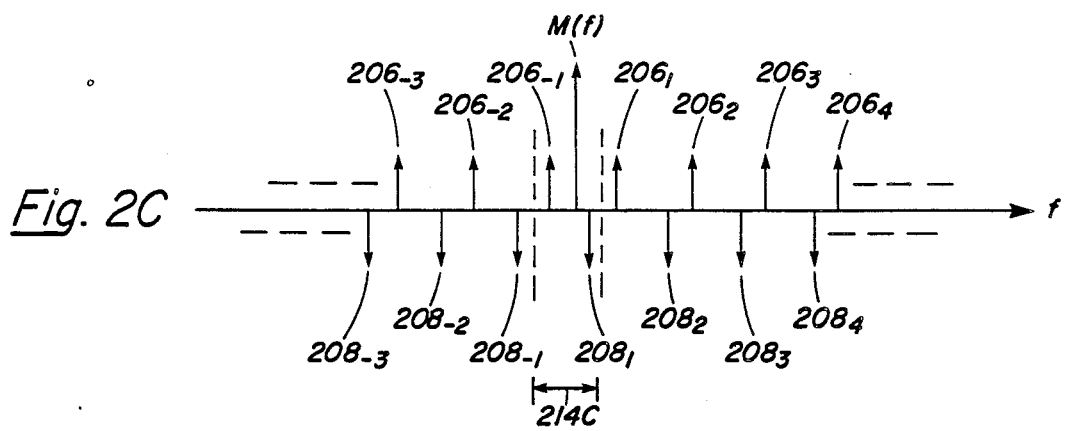
Figure 2D:

FIG. 2C of FIG. 2D shows the possible spectra of the signal produced by double balanced mixer 12. The $I_1$ and $Q_1$ signals have the same spectra since those signals differ only in phase, which is not reflected in the FIGS. 2B and 2C. FIG. 2C shows the first positive going impulse 206, occurs after the first negative going impulse 208. In contrast, FIG. 2D shows the first positive going impulse 210 occurs before the first negative going impulse $212_1$. Whether the spectrum of FIG. 2C or 2D occurs depends on the values of frequencies $f_i$ and $f_o$.

Sign measurement circuit 16 determines whether the spectrum of FIG. 2C or FIG. 2D has occurred. Filters 18A and 18B are low pass filters having a passband between $-f_o/2$ and $f_o/2$. The spectrum of the filtered signal will be the portion of the spectrum in region 214C or 214D. As can be seen, the spectrum of the filtered signal consists of one positive going impulse and one negative going impulse. In FIG. 2D, the positive going impulse $210_1$ is at a positive frequency and the negative going pulse $212_{-1}$ is at a negative frequency.

This arrangement of impulses in a frequency spectrum describes a sine wave with positive frequency. In contrast, the arrangement of frequency pulses in the spectrum of FIG. 2C describes a sine wave with negative frequency. In a positive-frequency sine wave, the value of the inphase signal $I_1$ will cross zero 90° before the value of the quadrature phase signal $Q_1$. In the negative-frequency sine wave, the signal $Q_1$ will cross zero 90° before the signal $I_1$. Sign measurement circuit 16 can determine if the spectrum of FIG. 2C or FIG. 2D exists by determining whether the $I_1$ or $Q_1$ time-domain signal crosses zero first.

A circuit to perform the function of sign measurement circuit 16 might contain a flip-flop circuit, the output of which is set when the $Q_1$ signal has a zero crossing and reset when the $I_1$ signal has a zero crossing. Thus, sign measurement circuit has an output of one (1) when a signal having the spectrum of FIG. 2D is applied to it and a value of zero (0) when a signal having the spectrum of FIG. 2C is applied to it. Such a circuit is well known in the art.

The filtered $I_1$ signal is also applied to frequency counter 19 as shown in FIG. 1. Frequency counter 19 comprises cycle counter 20, time counter 22, and divider 24. Cycle counter 20 counts the number of times the value of its input signal changes from positive to negative (i.e. "zero crossings"). Cycle counter 20 is constructed according to any known method.

Time counter 22 works in conjunction with cycle counter 20. When cycle counter 20 begins to count zero crossings of a signal, time counter 22 simultaneously begins to count, thereby measuring time. Both cycle counter 20 and time counter 22 will occasionally be reset to zero, also at the same time. For example, where the RF IN signal represents a pulsed signal detected by a receiver (not shown), cycle counter 20 and time counter 22 might be reset each time the receiver detects a new pulse.

The values in cycle counter 20 and time counter 22 are applied to a digital divider 24. The output of the divider represents the number of cycles divided by the number of seconds (i.e. the frequency) of the signal out of filter 18B.

The value of frequency computed at divider 24 is applied to frequency adjustment circuit 25. Frequency adjustment circuit 25 is constructed from well known digital arithmetic logic and control logic. In operation, the signal applied to number controlled oscillator 26 is at a frequency equal to the frequency of the input, $f_i$, down shifted by an integer multiple of the comb frequency $f_o$. The output of frequency counter 19 will have this value if the $I_1$ and $Q_1$ signals have a spectrum as shown in FIG. 2D. An adjustment will be needed if the signals $I_1$ and $Q_1$ have a spectrum as shown in FIG. 2C. That correction is provided as follows:

For the spectra of FIG. 2C and FIG. 2D, the positive impulse $206_1$ or $210_1$ passed by the filters 18A and 18B results from the positive impulse 200 in the spectrum of the input signal. The impulse at frequency $f_i$ is down converted an amount $nf_o$ in double balanced mixer 12 where n is an integer. The frequency of the positive impulse is $(f_i - nf_o)$. For the spectrum of FIG. 2D, the quantity $(f_i - nf_o)$ is a positive number. In contrast, the spectrum in FIG. 2C, the quantity $(f_i - nf_o)$ is a negative number. Whether $(f_i - nf_o)$ is positive or negative is significant because the frequency computed at divider 24 will relate to the absolute value of this quantity. For the spectrum of FIG. 2C, the frequency computed by divider 24 will be $$|f_i - nf_o| = nf_o - f_i \qquad \text{Eq. 1}$$

Eq. 1 shows that or the spectrum shown in FIG. 2C, the frequency counted by frequency counter 19 is not $f_i$ shifted by an integer multiple. The impulse $206_1$ is the lowest frequency impulse shifted by an integer multiple of $f_o$. Frequency adjustment circuit 25 adds an amount to the frequency measured by frequency counter 19 to equal the frequency of impulse $206_1$. The adjustment is only required when the signals out of filters 18A and 18B have the spectrum of FIG. 2C which is determined by sign measurement circuit 16.

The adjustment is achieved by subtracting the measured frequency from $f_o$. From Eq. 1, this can be seen to produce a frequency equal to $f_i$ offset by an integer multiple of $f_o$ as follows:

$$f_o - (nf_o - f_i) = f_i - (n-1)f_o \qquad \text{Eq. 2}$$

It might also be noted that the positive going pulse $206_1$ and $208_1$ are symmetrically disposed about zero frequency. The same analysis applies to the negative going pulse $208_1$.

The value representing frequency is applied to number controlled oscillator 26. Number controlled oscillator 26 produces an analog signal at a frequency dictated by the digital values at its input.

Number controlled oscillator 26 is constructed in any known manner. Number controlled oscillator 26 produces an in-phase signal $I_2$ and a quadrature phase signal $Q_2$. Both signals $I_2$ and $Q_2$ are applied to double balanced mixer 28. Double balanced mixer 28 is the same as double balanced mixer 12, though it is configure differently. The $I_1$ and $Q_1$ terminals of double balanced mixer 12 are outputs whereas the $I_2$ and $Q_2$ terminals of double balanced mixer 28 are inputs.

Comb generator 34 provides the second input to double balanced mixer 28. Comb generator 34 operates like comb generator 32 to produce a comb of frequencies spaced by $f_o$.

The output of double balanced mixer 28 has a frequency spectrum consisting of the spectrum of the signal out of number controlled oscillator 26 replicated at intervals of $f_o$. The possible arrangements of the spectrum are shown in FIGS. 2E and 2F.

From Eqs. 1 and 2, it can be seen that the spectrum of the signal out of number controlled oscillator 26 will have a positive going impulse at the frequency of the input signal, $f_i$, offset by an integer multiple of $f_o$. Replicating this spectrum at intervals of $f_o$ means that one of the replicated impulses is at the frequency $f_i$. By symmetry, one of the negative going impulses will be at the frequency $-f_i$. By filtering out the positive going impulse at $f_i$ and the negative going impulse at $-f_i$, the spectrum of the input signal is recreated. Filter bank 30 filters out the correct frequency impulses.

Filter bank 30 consists of a bank of band pass filters, each with a passband of width $f_o/2$. FIGS. 2E and 2F show that the frequency band is divided into segments $216_1$, $216_2$, $216_3$, $216_4$ . . . Each segment spans a frequency of $f_o$ and starts at a frequency which is an integer multiple of $f_o$. Since each segment spans a frequency of $f_o$, two filters cover each band. For example, segment $216_1$ is divided into two bands $216_{1a}$ and $216_{1b}$, each band corresponding to the passband of one of the filters in filter bank 30. Each of the other segments $216_2$, $216_3$, $216_4$ . . . is likewise divided into two bands with each band corresponding to one of the filters.

The filters of filter bank 30 also pass negative frequency components, as is required for physically realizable filters. Thus, a filter passing frequencies between $mf_o/2$ and $(mf_o/2+f_o/2)$ also passes frequencies between $-mf_o/2$ and $-(mf_o/2+f_o/2)$. Segments of negative frequency $218_1$, $218_2$, $218_3$, $218_4$ . . . are shown to correspond to the segments of positive frequency $216_1$, $216_2$, $216_3$, $216_4$ . . . to reflect this arrangement.

With the widths of the passbands and placements of the passbands in frequency as shown in FIGS. 2E and 2F, the positive going impulse at frequency $f_i$ and the negative going impulse at frequency $-f_i$ fall in one of the positive bands $216_{1a}$, $216_{1b}$, $216_{2a}$, $216_{2b}$ . . . and the corresponding one of the negative bands $218_{1a}$, $218_{1b}$, $218_{2a}$, $218_{2b}$ . . . More importantly, only one frequency impulse appears in one band. To produce the appropriate frequency spectrum, the output of the appropriate one of the filters in filter bank 30 must be selected.

Multiplexer 36 (MUX) contains a bank of switches that selects the output of the appropriate one of the filters in filter bank 30. The output of that filter is coupled via MUX 36 to the RF OUT port where it can be used. Here, MUX 36 is any known multiplexer for analog signals.

The control signals to MUX 36 that dictate which filter to select are provided by fast IFM circuit 10 and sign measurement circuit 16. Fast IFM circuit 10 comprises any known method for quickly estimating the frequency of a signal. Fast IFM circuit 10 might consist of a bank of band pass filters similar to filter bank 30 followed by RF signal detectors. However, any known method for quickly making a coarse estimate of the frequency of an RF signal may be used. Fast IFM circuit 10 only has to identify into which of the frequency segments $216_1$, $216_2$, $216_3$, $216_4$ . . . the input signal falls. It does not need to identify the frequency of the input signal with sufficient accuracy to control number controlled oscillator 26 and can thus by simply and inexpensively built.

Multiplexer 36 selects the output of one of the filters in filter bank 30 covering the segment identified by fast IFM circuit 10. There are two filters corresponding to the two bands in each segment. Multiplexer 36 selects one of these filters based on the output of sign measurement circuit 16. If the output of sign measurement circuit 16 has a value indicating the signals out of filters 18A and 18B have the spectrum of FIG. 2D, the filter corresponding to the lower frequency band in the frequency segment is selected.

That the lower frequency band is the appropriate choice can be understood by observing that the positive going impulse of frequency 210 is selected by the filter. The positive going impulse $210_1$ occurs at a frequency between 0 and $f_o/2$. When this frequency is upconverted by an integer multiple of $f_o$, it will fall at a frequency above that integer multiple by less than $f_o/2$. Each of the segments $216_1$, $216_2$, $216_3$, $216_4$ . . . starts at a frequency equal to an integer multiple of $f_o$. The lower frequency band, since it extends only $f_o/2$ in frequency, in each segment $216_{1a}$, $216_{2a}$, $216_{3a}$, $216_{4a}$ . . . contains the impulse.

Conversely, when the spectrum of FIG. 2C occurs and is detected by sign measurement circuit 16, the filter corresponding to the higher frequency band of the segment dictated by fast IFM circuit 10 is selected by MUX 36. With this spectrum, frequency adjustment circuit 25 adjusts number-controlled oscillator 26 so that its output equals the frequency determined by frequency counter 19 to produce a signal at the same frequency as positive going impulse $206_1$. That impulse falls at frequency between $f_o/2$ and $f_o$. When that frequency is upconverted an integer multiple of $f_o$, the resulting frequency will be above a multiple of $f_o$ by $f_o/2$ to $f_o$. The frequency, thus, falls into one of the upper frequency bands $216_{1b}$, $216_{2b}$, $216_{3b}$, $216_{4b}$ . . .

In operation, when an RF signal is applied to the terminal RF IN, the set-on oscillator of FIG. 1 begins to lock onto the frequency of the signal. Cycle counter 20 and time counter 22 both begin to count. After a few cycles are counted, the output of the divider 24 gives an approximate computation of frequency. The approximation may be close enough to produce a useful output signal at terminal RF OUT. As more cycles are counted, the frequency of the output signal more closely approximates the frequency of the input signal.

It should be understood by those of skill in the art that various modifications may be made in the present invention without departing from the spirit and scope thereof as described in the specification and defined in the appended claims.

What is claimed is:

1. A circuit for producing an output signal at substantially the same frequency as the frequency of an input signal, comprising:
   (a) means for producing a first signal having a frequency spectrum comprising the frequency spectrum of the input signal replicated at a predetermined frequency spacing;
   (b) means for filtering the first signal to produce a second signal having frequency components at frequencies less than one-half of the predetermined frequency spacing;
   (c) means for determining whether the second signal has a frequency spectrum containing a significant frequency component at a first frequency equal to the difference between:
(i) the frequency of the input signal; and
(ii) an integer multiple of the predetermined frequency spacing.

2. The circuit of claim 1 additionally comprising:
(a) means, responsive to the filtering means and the determining means, for producing a third signal indicative of frequency, said third signal
(i) indicating the frequency of the second signal when the determining means indicates the second signal contains a significant frequency component at the first frequency; and
(ii) indicating the frequency of the second signal offset by a second frequency.

3. The circuit of claim 2 additionally comprising:
(a) means, responsive to the means for producing a third signal indicative of frequency, for producing a signal at the frequency indicated by means for producing a third signal indicative of frequency.

4. The circuit of claim 3 additionally comprising:
(a) means, responsive to the means for producing a third signal, for producing a fourth signal having a frequency spectrum comprising the spectrum of the third signal replicated at the predetermined frequency spacing.

5. The circuit of claim 4 additionally comprising:
(a) means for filtering the fourth signal to produce an output signal having a frequency substantially equal to the frequency of the input signal.

6. The circuit of claim 1 wherein the predetermined frequency is below the frequency of the input signal.

7. An apparatus for producing an output signal of substantially the same frequency as the frequency of an input signal comprising:
(a) means for producing a first comb signal having a spectrum containing frequency components at periodically occurring frequencies, said frequencies separated by a predetermined frequency;
(b) first means, responsive to the input signal and the means for producing the first comb signal, for mixing the input signal and the first comb signal, said mixing means producing an in-phase signal and a quadrature phase signal;
(c) filtering means for filtering out frequencies of the in-phase and quadrature phase signals above one-half of the predetermined frequency; and
(d) means for determining if the in-phase signal has a zero crossing before the zero crossing of the quadrature phase signal.

8. The apparatus of claim 7 additionally comprising:
(a) means for producing first frequency indicating signal indicating the frequency of the filtered in-phase signal;
(b) means, responsive to the means for producing a first frequency indicating signal and the means for determining zero crossing, for producing a second frequency indicating a signal, said second frequency indicating signal indicating
(i) the frequency of the filtered in-phase signal when the means for determining zero crossings indicated the in-phase signal has a zero crossing before the quadrature phase signal;
(ii) the difference between the predetermined frequency and the frequency of the filtered in-phase signal when the means for determining zero crossings does not indicate the in-phase signal has a zero crossing before the quadrature phase signal.

9. The apparatus of claim 8, additionally comprising:
(a) oscillator means, responsive to the means for producing a second frequency indicating signal, for producing a signal having the frequency indicated by the second frequency indicating signal;
(b) means for producing a second comb signal having a spectrum containing frequency components at periodically occurring frequencies, said frequencies separated by the predetermined frequency; and
(c) second means, responsive to the means for producing a signal and the means for producing a second comb signal, for mixing the second comb signal and the produced signal.

10. The apparatus of claim 9 additionally comprising:
(a) means for determining into which of a first plurality of frequency segments the frequency of the input signal falls;
(b) a second plurality of band pass filters, the second plurality equalling twice the first plurality of frequency segments, and each filter passing frequencies in a band with a width equal to one-half of the width of each segment, and the input of each filter being coupled to the output of the second mixing means; and
(c) means, responsive to the means for determining frequency and the means for determining zero crossings, for selecting as the output the output of one of the band pass filters.

* * * * *